United States Patent [19]

McLaury

[11] Patent Number: 5,325,502
[45] Date of Patent: Jun. 28, 1994

[54] PIPELINED SAM REGISTER SERIAL OUTPUT

[75] Inventor: Loren L. McLaury, Boise, Id.

[73] Assignee: Micron Technology, Inc., Boise, Id.

[21] Appl. No.: 701,470

[22] Filed: May 15, 1991

[51] Int. Cl.$^5$ .............................................. G06F 9/32
[52] U.S. Cl. ............................. 395/425; 364/DIG. 1; 364/244.8; 364/249.2; 364/251.4; 364/261.8
[58] Field of Search ... 364/200 MS File, 900 MS File; 395/400, 425; 365/200

[56] References Cited

U.S. PATENT DOCUMENTS

| | | | |
|---|---|---|---|
| 4,891,795 | 1/1990 | Pinkham et al. | 365/230.03 |
| 5,042,014 | 8/1991 | Pinkham et al. | 365/230.05 |
| 5,097,447 | 5/1992 | Ogawa et al. | 365/200 |
| 5,179,372 | 1/1993 | West et al. | 340/799 |
| 5,198,999 | 3/1993 | Abe et al. | 365/189.05 |
| 5,200,925 | 4/1993 | Morooka | 365/219 |
| 5,206,831 | 4/1993 | Wakamatsu | 365/200 |

Primary Examiner—Joseph L. Dixon
Assistant Examiner—Hiep T. Nguyen
Attorney, Agent, or Firm—William R. Bachand

[57] ABSTRACT

Serial clock cycle time for a serial read operation in a semiconductor memory is reduced by partitioning the read operation into a sensing operation, a counter operation and an output operation, and conducting all three operations simultaneously in a pipelined fashion. To carry out the new method, the memory effectively is pipelined by providing a read register (92) between the sensing flip-flop (90) and the output latch/driver (96), and by isolating the address counter (48) from the address decoder circuitry (56) by inserting an isolation buffer (52). Additionally, the serial access time is reduced by conducting a look-ahead load (72) of a first tap address at the conclusion of a read transfer cycle, without waiting for the serial clock signal (SC) to begin the read cycle.

20 Claims, 12 Drawing Sheets

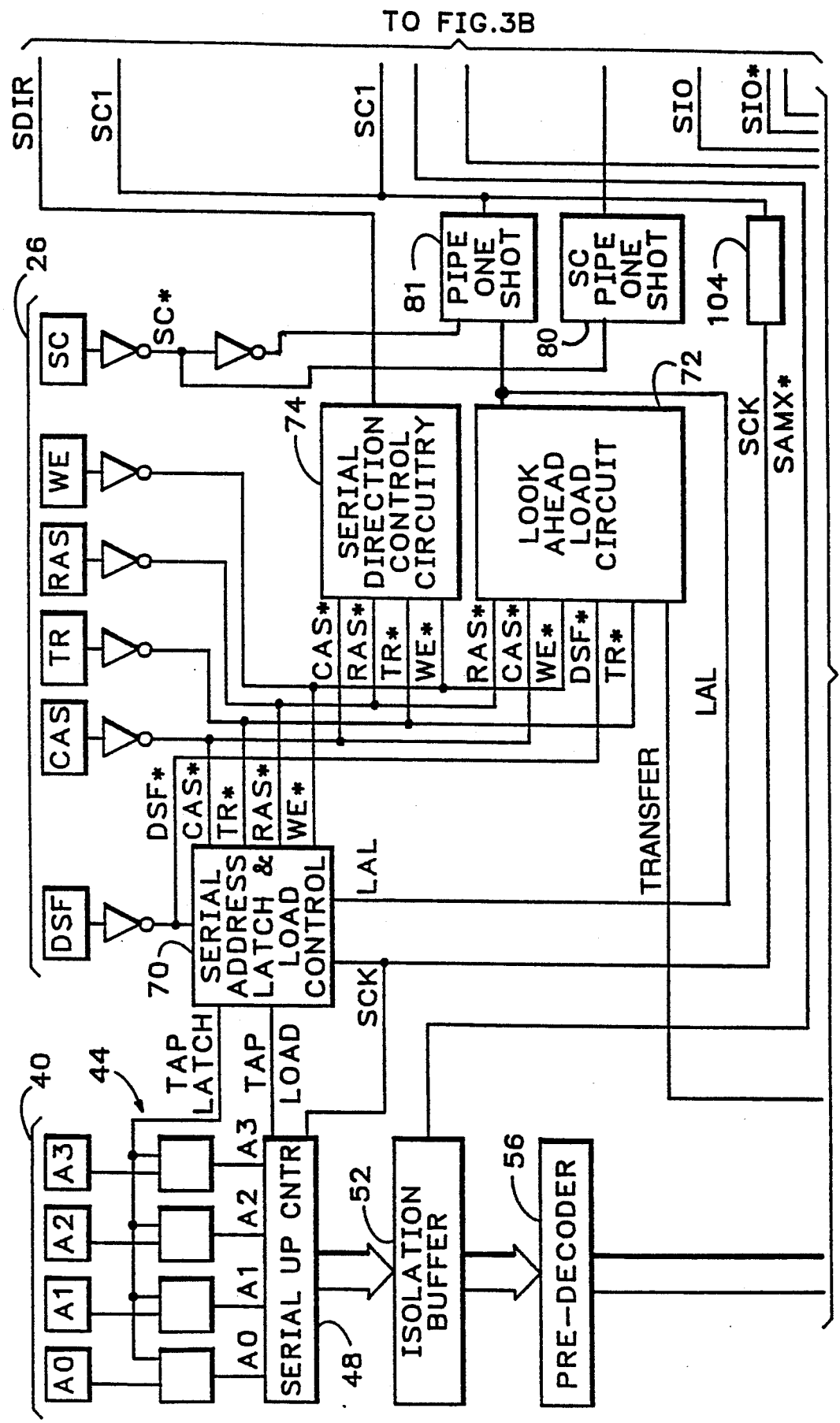

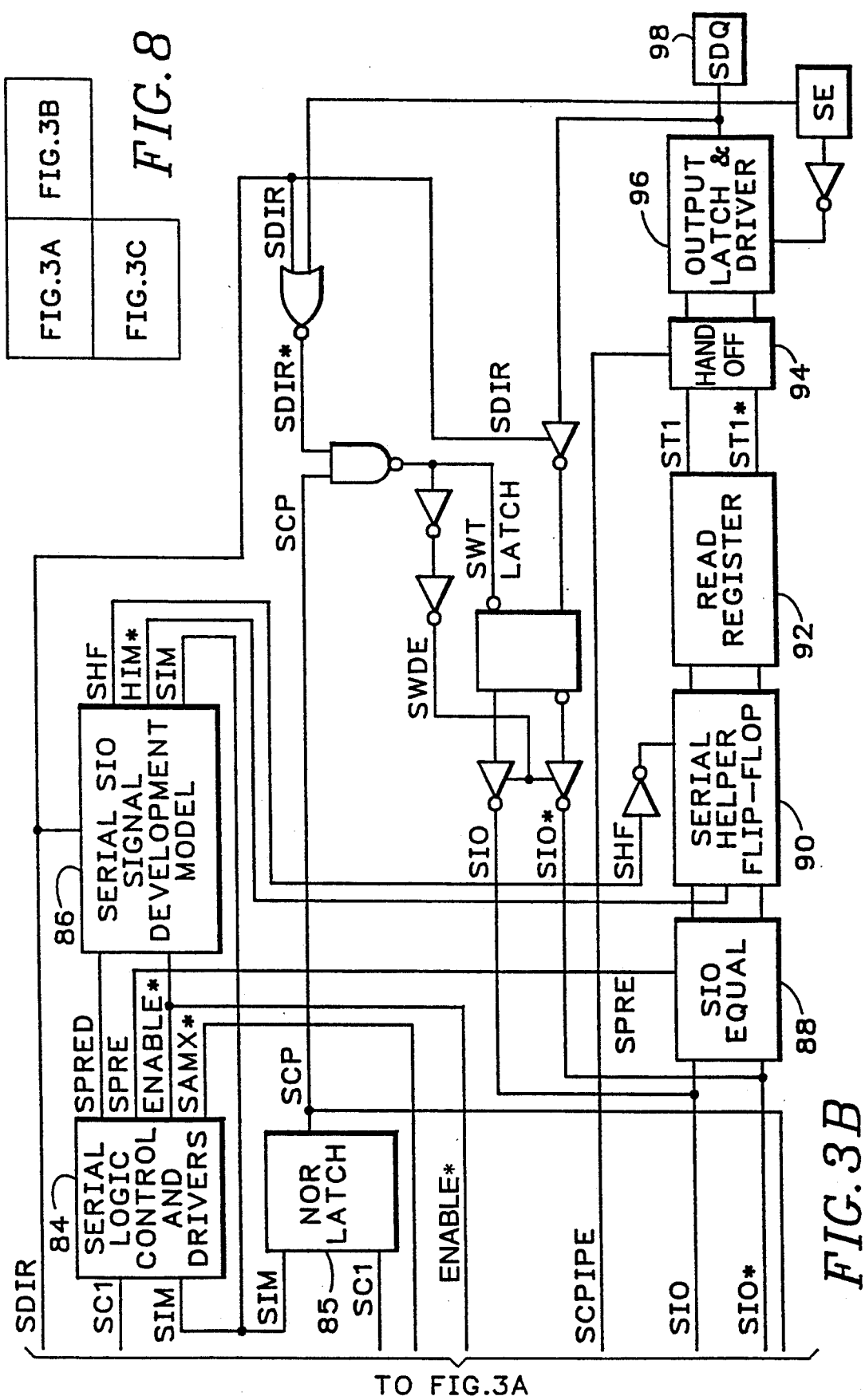

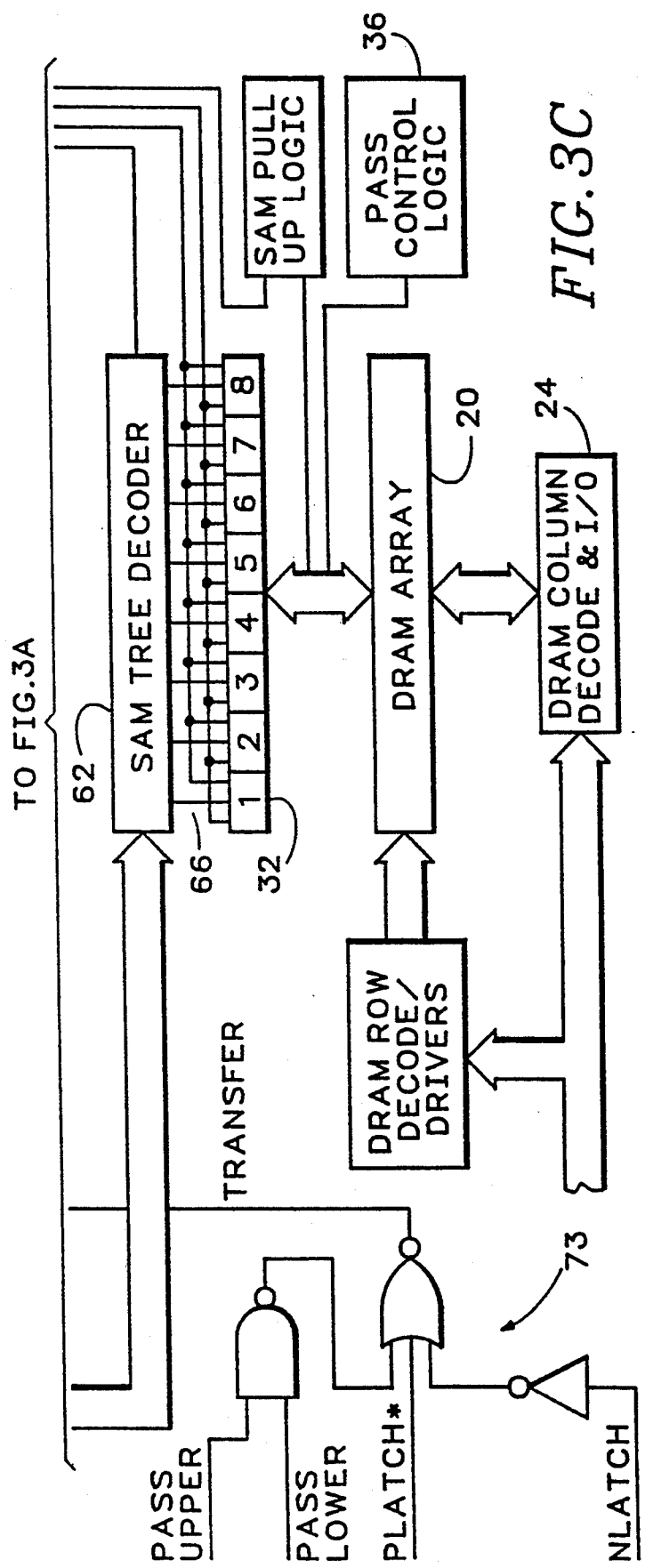

PIPELINED SAM REGISTER SERIAL OUTPUT

FIELD OF THE INVENTION

This invention relates to semiconductor memory integrated circuits and, more particularly, to serial input and output operations in multiple port random access memory devices.

BACKGROUND OF THE INVENTION

A video RAM (VRAM), sometimes called a dual-port RAM, is a DRAM (Dynamic Random Access Memory) having a serial I/O port coupled to a serial access memory (SAM). The SAM permits a block of stored data to be rapidly accessed, while the normal access function of the DRAM is also occurring. The information in the SAM is normally obtained from, or input into, a primary memory on the VRAM. The primary memory may be configured as a DRAM array and is accessed according to DRAM protocols.

Information may be written into the VRAM at DRAM address speeds and output through the serial access port, or vice versa. This is convenient for video applications because some address sequences, such as pixels in a raster scan, are predetermined. An object of the present invention is to increase the speed at which data is output to the serial port in a VRAM.

SUMMARY OF THE INVENTION

The present invention contemplates modifications to a video RAM or VRAM to increase the speed of reading data at the serial port.

In the prior art, each rising edge of a serial clock or SC clock signal causes the serial port logic to fetch a bit out of the SAM register(s), sense it, and send it to the serial output terminal. What others have failed to recognize is that the time necessary to drive the serial output terminal to the correct state is approximately the same as the time it took to sense the particular bit of interest. In known circuits, these delays are cumulative. A better approach is to break the read cycle into two separate parts that can operate in parallel, i.e. concurrently. This new method is called pipelined serial output.

Briefly, to implement the pipelined read operation requires (1) isolating the pre-decoder from the address counter to allow incrementing the counter sooner; and (2) isolating the output latch from the sense amp flip-flop to allow driving the output pad to the previous data bit state while sensing the current data bit and latching it in a read register. Much higher operating speed results, as further described below.

Another aspect of the invention is look-ahead load circuitry for pre-loading the serial output pipeline by fetching and sensing a first data bit during the read transfer cycle, so that the first data bit can be output immediately in response to the first serial clock signal.

According to the new method, while a data bit is being sensed, we simultaneously drive a previous bit onto the serial output terminal. Much higher operating speed results, as further described below.

The foregoing and other objects, features and advantages of the invention will become more readily apparent from the following detailed description of a preferred embodiment which proceeds with reference to the drawings.

BRIEF DESCRIPTION OF THE DRAWINGS

FIGS. 3A-3C together form a block diagram of pertinent portions of a VRAM according to the present invention.

FIG. 8 is a diagram showing the arrangement of FIGS. 3A, 3B, and 3C.

DETAILED DESCRIPTION OF PREFERRED EMBODIMENTS

Figure 1A:
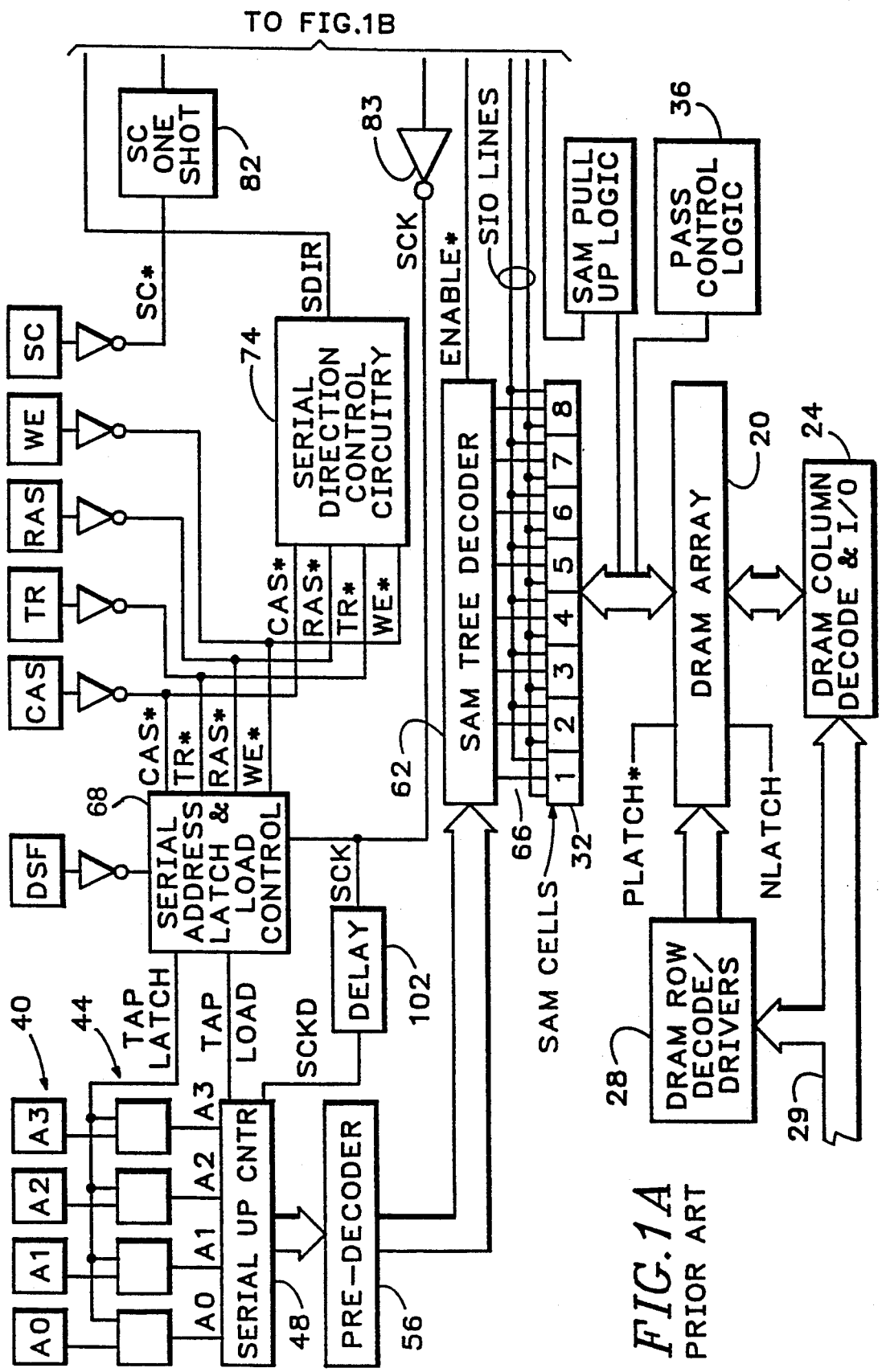
FIGS. 1A-1B together form a block diagram of pertinent portions of a known VRAM.
Figure 1B:
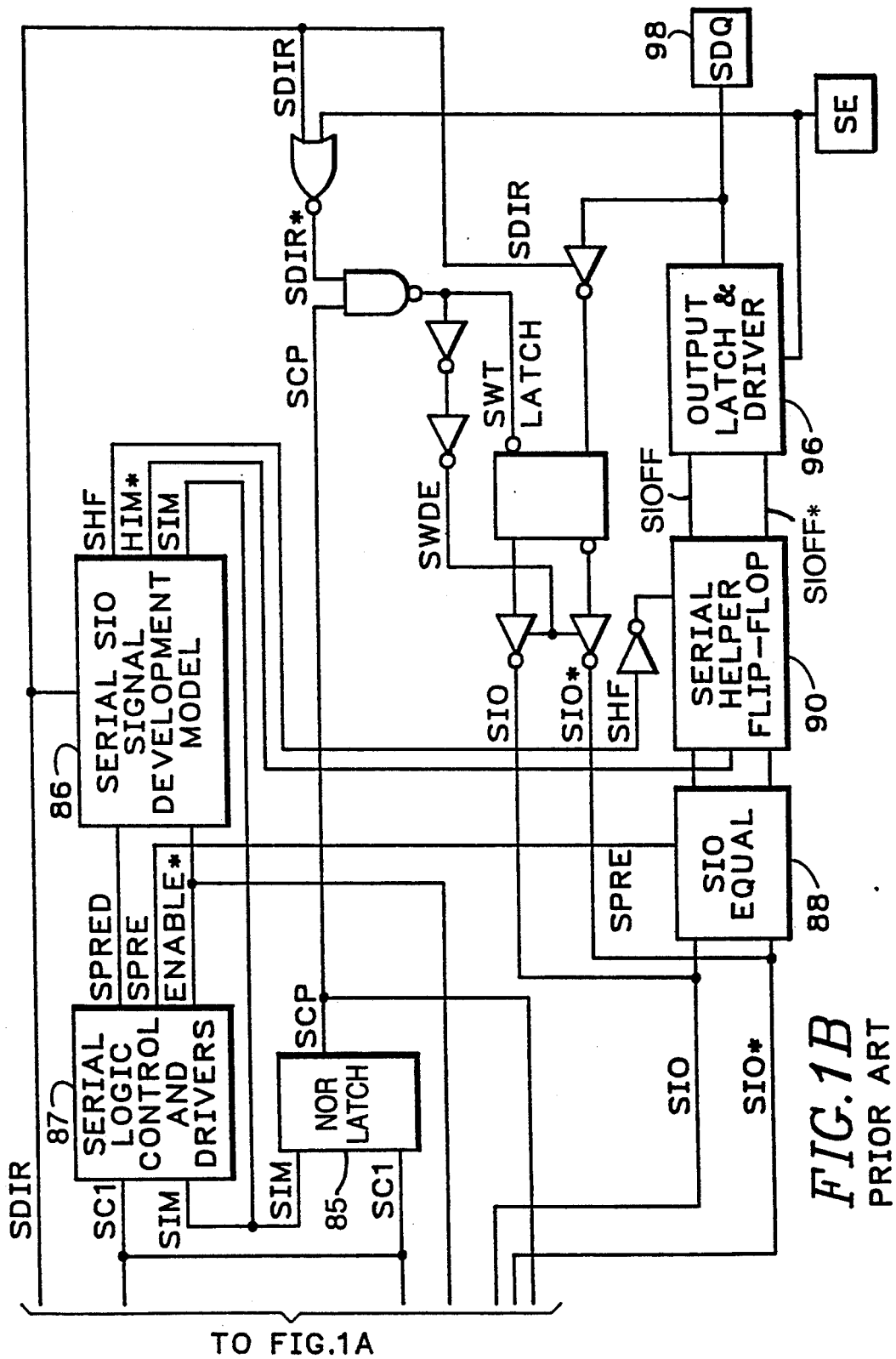

The present invention is best understood by first summarizing operation of a known VRAM. Referring to FIG. 1, portions of a known VRAM pertinent to the serial output port are shown in a block diagram. A DRAM array 20 (FIG. 1A) is addressed by column decode and I/O circuitry 24 and row decoder/driver circuitry 28. Row and column address information are provided to the decoders along a common bus 29. A serial access memory or SAM register 32 is coupled to the DRAM array and includes one cell (or latch) for each column or bit position in the DRAM array 20. Here, only eight SAM latches, numbered 1-8, are shown for clarity. In an actual commercial embodiment, the SAM register is likely to include, for example, 512 bits. Transfers between the SAM register and the DRAM array are controlled by pass control logic 36.

Transfer Operations

A transfer operation moves a row of data between the DRAM array and the SAM register as follows: into the SAM (i.e. out of the DRAM) for a read transfer, and out of the SAM (i.e. into the DRAM) for a write transfer. Control signal input terminals TR and WE, shown along the top of FIG. 1A, control transfer operations. In general, a transfer operation is initiated when a transfer enable signal TR/OE is low prior to or at RAS going low. A directional control signal, ME/WE, indicates the direction of the transfer, and must be high as RAS (Row Address Strobe) goes low for a DRAM-to-SAM transfer, i.e. for a read.

Row address bits are provided along bus 29 to select the DRAM array row to be transferred to the SAM register. RAS and CAS logic signals are used to strobe the row and TAP address bits, respectively, into the circuit. To complete the read transfer operation, TR/OE is taken high while RAS and CAS are still low.

The selected bits of DRAM data are then written into the SAM register.

In serial output operations, a SAM starting address (SSA) or "TAP address" is provided to a series of address input terminals 40, and latched in a serial TAP address latch 44. For illustration purposes, four such address input terminals A0–A3 are shown. In practice, the number of terminals would be adequate to select one bit in the SAM, e.g. 9 address bits for a 512-bit SAM. The TAP address is loaded into a pre-settable serial up-counter 48. The TAP address latch and load counter operations are controlled by serial address latch and load control circuits 68.

The state of up-counter 48 is provided to pre-decoder circuitry 56 which, in turn, provides address data to a SAM tree decoder 62. Tree decoder 62 decodes the TAP address to access a selected one of the SAM latches. The selected SAM latch contains the first bit to be sensed and output during a serial output or read operation. Thereafter, up-counter 48 is incremented so that successive SAM latches are accessed, sequentially, for reading the SAM data serially until the remainder of the data in the SAM register has been output or a different operation is invoked.

Serial Read Operation

The serial read operation is controlled by the serial clock signal SC provided at the SC input terminal. In response to a rising edge on the SC signal, the address in up-counter 48 is allowed to flow through the SAM address predecoder and into the SAM tree decoder 62 to access a selected SAM cell. See logic signals SC*, SC1, SCK, SCKD. The selected SAM cell transfers information onto the SIO lines (SIO, SIO*) as follows.

The SAM cell is similar to a cross-coupled static latch. The SIO lines are pre-charged high. After the selected SAM cell is coupled to the SIO lines, a signal is developed gradually as one of the SIO lines falls toward a logic low. The amount of voltage displacement or the amount of charge that develops depends upon the time provided. The time is determined in a serial SIO signal development model 86. This circuitry essentially models the time necessary for a predetermined voltage change of, for example, 200 Mv or 300 Mv on the SIO lines. The read operation is illustrated in the timing diagram of FIG. 2.

Figure 2:
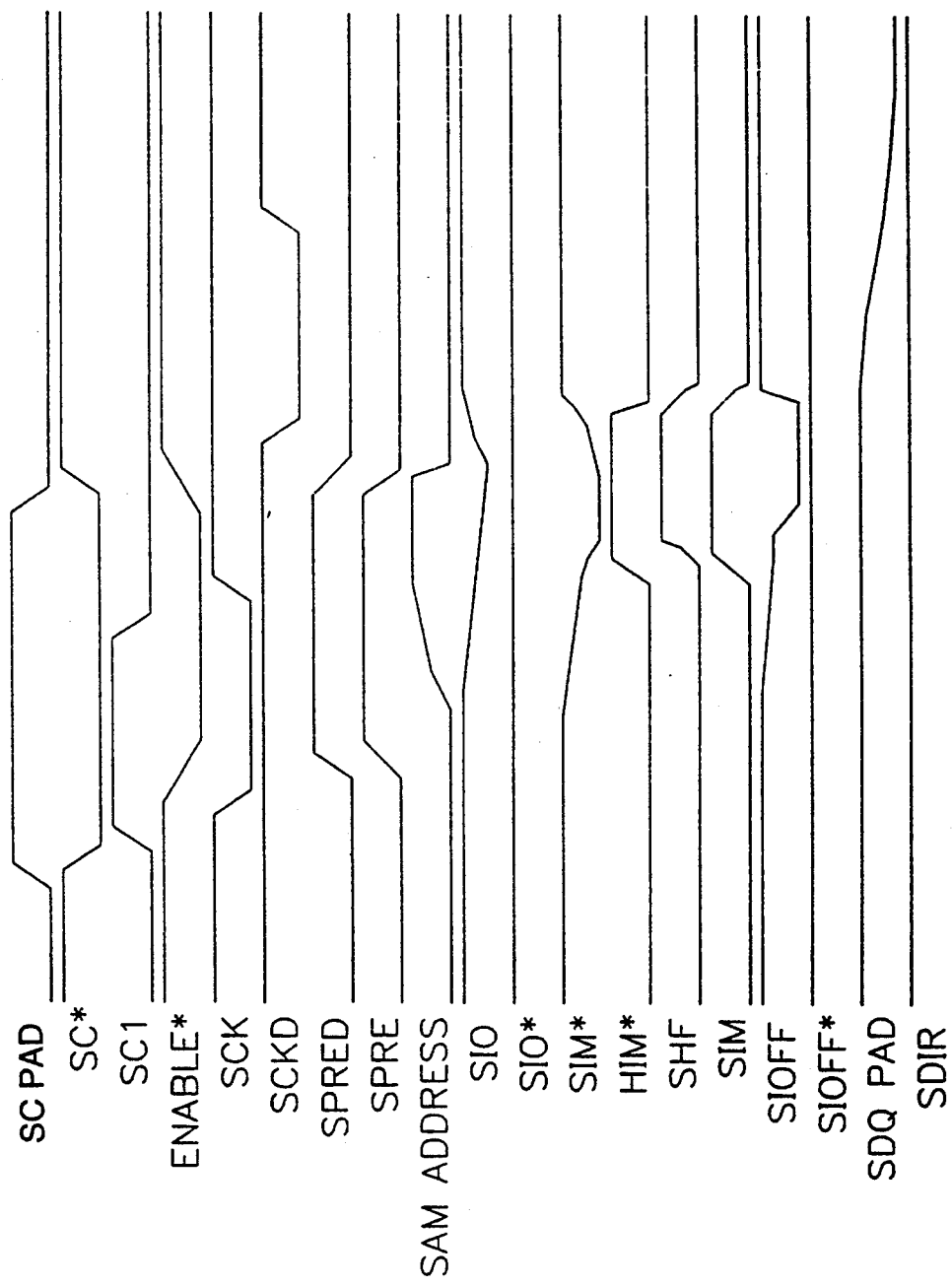
FIG. 2 is a timing diagram showing serial output waveforms using the circuitry of FIGS. 1A-1B.

At the conclusion of a time period determined by model 86, logic signal HIM* isolates helper flip-flop 90 (operating as a serial sense amp) from the SIO lines, and logic signal SHF enables sensing by helper flip-flop circuit 90. The serial sense amp samples the SIO lines and latches the data. The flip-flop output data SIOFF, SIOFF* then flows out to an output latch and driver circuit 96. Circuit 96 latches the valid information and drives the serial data IO terminal (SDQ) 98 to the state of the latched data. The timing of these operations is controlled by serial logic control and drivers circuitry 87 and by other circuitry further described below, as illustrated in FIG. 2. Next, the up-counter 48 is incremented, and the foregoing process repeated to read the next bit.

To summarize, in a known VRAM, reading serial data from the device includes first conducting a DRAM-to-SAM (read) transfer operation, to transfer a selected row (or partial row) of data from the DRAM array into the SAM register. Next, a read operation controlled by the serial clock SC is initiated. The read operation includes the following sequence of events for each bit:

1. Send TAP address data from up-counter 48 to a tree decoder 62 and enable the tree decoder;
2. dump the selected SAM cell contents onto the SIO lines;
3. sense the SIO lines;
4. latch the serial sense amp (enable helper flip-flop 90);
5. send latched data to output driver 96;
6. increment address counter 48;
7. drive the output pin SDQ; and
8. equalize the SIO lines and serial sense amp.

This sequence of tasks is carried out by the logic signals illustrated in the timing diagram of FIG. 2 for reading a zero when the previous bit read was a one.

Logic Signal Timing

Referring to FIG. 2, the serial read operation begins with the rising edge on the SC signal and proceeds as follows.

1. SC* drives an SC one-shot circuit 82 (FIG. 1A) which provides a positive pulse on SC1.
2. ENABLE* goes low enabling the SAM tree decoder 62 (previously disabled).
3. SCK goes low and starts working its way through the SCK delay circuitry 102.
4. SPRED goes high enabling Serial SIO Signal Development Model 86.
5. SPRE goes high disabling the SIO equalization/precharge circuitry 88.
6. The TAP address works its way through the tree decoder forming SAM ADDRESS (66) which accesses the particular SAM cell desired.
7. A period of time is provided for the SAM cell accessed to develop signal onto the SIO lines. This period is determined by the Serial Model (86), which accounts for the delays involved and allows enough signal to develop on the SIO lines so that a correct decision can be made at the Serial Helper flip-flop (90) as to which SIO line (SIO or SIO*) is lower in voltage.
8. SIM* (a signal internal to the model 86) has now moved low enough to cause HIM* to go high, thereby isolating the Serial Helper flip-flop from the SIO lines.
9. Shortly thereafter, SHF goes high, enabling the Serial Helper flip-flop to pull down and make the decision as to which SIO line was lower.
10. Also at this time, SIM goes high resetting NOR latches in the Serial Logic Control circuitry (87) (see 12,13 below) and SCP latch.
11. After one side of the Serial Helper flip-flop 90 has pulled low enough to trip an internal invertor, the data (SIOFF/SIOFF*) ripples out through output latch (96) and subsequently drives the SDQ output terminal (98) to the proper state.
12. ENABLE* is reset high, disabling the SAM tree decoder, and resetting the Serial Model.
13. Concurrently, SPRE goes low equalizing and precharging the SIO lines to VCC.
14. The SCK pulse now has worked its way through the SCK delay circuitry (102) and SCKD goes low, causing up-counter (48) to increment to the next address to be accessed.
15. SPRED goes low also putting the serial model into precharge (pulling SIM* back to a high state), which eventually pulls HIM*, SHF, and SIM back to a low state.

Importantly, steps 2, 3, 4 and 5 happen almost simultaneously. Step 11 takes more time than steps 12, 13, 14 and 15 combined. SDIR (which is set in a transfer) must be high throughout. In a commercial part, for the above read operation, the overall access time from SC, called $t_{SAC}$, is typically about 25 to 40 nsec.

THE NEW PIPELINED READ OPERATION

Modified Hardware Overview

Review and reconsideration of the foregoing operations revealed that the serial access time comprised three major elements or delays: (1) the time after selecting a desired SAM cell necessary to develop signal on the SIO lines and sense those lines; (2) the delay necessary to allow an address to flow through the pre-decoder, SAM decoder, and SAM itself before incrementing the address counter; and (3) the time necessary for driving the output pad to the correct state.

Little can be done within the confines of present designs to reduce any of these three delays. However, substantial improvements in performance are achieved by carrying out at least some of these steps concurrently rather than seriatim. To do so requires breaking the serial read operation into more than one group of events, and allowing the groups to proceed concurrently in a pipelined fashion. To be profitable, the groups must be selected and the pipeline arranged so that the long delay events identified above can be carried out concurrently by placing them in separate segments of the pipeline.

In a preferred embodiment, the read operation is pipelined as follows. The address decoding and sensing steps are carried out for a current data bit while a previous data bit is being output, i.e. while the output latch/driver drives the output pad to the state of the previous data bit. Additionally, the address counter is incremented to a subsequent address while the decoding and sensing proceed with respect to the current address.

Briefly, to implement the pipelined read operation requires (1) isolating the pre-decoder from the address counter to allow incrementing the counter sooner; (2) isolating the output latch from the sense amp flip-flop to allow driving the output pad to the previous data bit state while sensing the current data bit and latching it in a read register; and (3) providing look-ahead load circuitry for preloading the new "pipeline" so that the first data bit is available to the output latch almost immediately after receipt of the first SC clock edge in a serial read operation.

A preferred circuitry for implementing the new pipeline strategy in an integrated circuit memory device is described next. The new circuitry is illustrated in FIGS. 3-9 in the drawing. FIGS. 3A-3C together form a block diagram of pertinent portions of a VRAM circuit according to the invention. In these figures, much of the circuitry is similar to that shown and described with respect to the known VRAM of FIGS. 1A-1B. Like reference numbers are used to identify elements common to both circuits.

(1) Isolate Pre-decoder from Address Counter

Referring to FIG. 3A, a new isolation buffer 52 is provided between the address counter 48 and the pre-decoder circuit 56. The isolation buffer isolates the address counter outputs (state) from the pre-decoder circuit in response to a control signal SAMX*. SAMX* is generated, in the serial logic circuit 84, slightly after the beginning of any SC cycle. The isolation buffer 52 obviates the substantial delay provided by delay circuit 102 in the prior art (FIG. 1A), as it is no longer necessary to wait for the address to propagate through the tree decoder and SAM register before incrementing the counter. In the embodiment shown, intrinsic capacitance between series stages of isolation buffer 52 holds the output of isolation buffer 52 for supporting continued operation of pre-decoder 56. The isolation buffer thus allows the counter to be incremented sooner in the read operation.

(2) Isolate Output Latch from Sense Amp Flip-Flop

Figure 7:
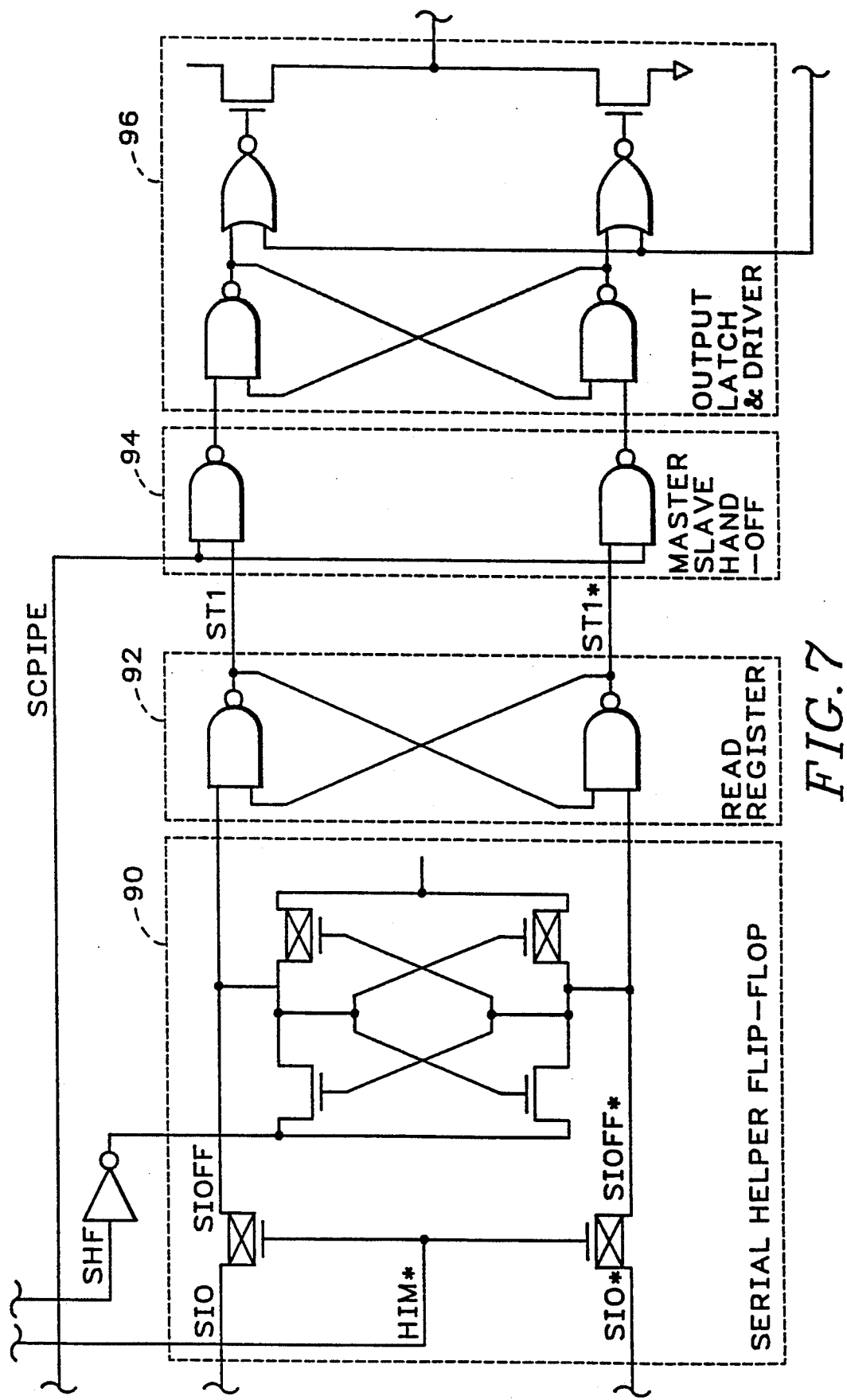
FIG. 7 is a schematic diagram showing detail of the serial helper flip flop, read register, master-slave hand-off circuit and output latch of FIG. 3B.

Referring to FIGS. 3B and 7, a new read register 92 is disposed between the serial helper flip-flop 90 and the output latch & driver 96 to isolate the output latch from the serial helper flip-flop. A first output bit is latched in the read register immediately after enabling helper flip-flop 90 (see FIG. 7). A master-slave hand-off circuit 94 is disposed between the read register 92 and the output latch 96. The read register, master-slave hand-off circuit and output latch together form a master-slave flip-flop circuit. The hand-off circuit, formed of NAND gates, is enabled by a pulse on a control signal SCPIPE to transfer the first output bit from the read register to the output latch. Another new circuit called the SC PIPE ONE-SHOT 80 (see FIG. 3A) is coupled to receive the serial clock signal SC* for providing the SCPIPE pulse in response to the serial clock signal. The first output bit is moved, in response to the SCPIPE pulse, into the output latch immediately after the SC* signal. A second output bit is stored in the read register while the output latch retains the state of the first output bit.

(3) Look-Ahead Load

A new look-ahead load scheme is employed to preload the serial pipeline by fetching and sensing a first data bit during the read transfer operation, i.e. without waiting for the SC clock signal.

A look-ahead load circuit 72 receives RAS* and CAS* strobe signals, write enable WE*, transfer enable TR*, and DSF (direction) signals. The states of CAS, WE, DSF and TR are latched in the look-ahead load circuit 72 when RAS falls. If the appropriate combination of states is present at that time, then signal LAL (look-ahead load) goes high. Look-ahead load circuit 72 also receives a new signal called TRANSFER that is asserted when a read transfer is occurring. The TRANSFER signal is generated by logic 73 (FIG. 3C). The look-ahead load circuit is arranged to assert a look-ahead load output signal (LAL) high, during a read transfer operation, following the rising edge of the TR PAD signal. That transition indicates the end of a read transfer operation. These relationships are illustrated in the timing diagram of FIG. 10.

A series of invertors or other delay means are used so that LAL actually is a pulse, having a longer duration than the SC1 pulse, which is generated in a pipe one-shot 81 in response to the LAL signal. LAL also is provided to the Serial Address Latch and Load Control circuit 70, which, in response, provides a TAP LOAD signal to load the latched address into the address up-counter 48.

The SC one-shot 82 of FIG. 1 is modified to include a NOR gate for triggering the one-shot responsive to either the SC clock signal or the LAL signal. The modified one-shot circuit is designated Pipe One-Shot 81 (see FIG. 3A and FIG. 4). Pipe one-shot circuit 81 provides a pulse called SC1 which in turn is coupled to the Serial Logic Control and Drivers circuit 84, to a NOR latch 85 and to a delay circuit 104. Delay circuit 104 in turn provides a signal SCK which is coupled to the address counter 48 for clocking the counter. SCK is delayed, but only slightly, to ensure that the address has been transferred into the isolation buffer before incrementing the counter.

Operation

Briefly, according to the present invention, a tap address is loaded at the end of the Read Transfer cycle, i.e. without waiting for an SC clock signal. The loaded tap address is pre-decoded and passed through the SAM decoder to select the corresponding SAM latch (data bit). The SAM location is sensed and the data loaded into the new Read Register. Then the tap address counter is incremented. All of this occurs prior to the first SC rising edge.

When the first SC rising edge occurs, the Read Register data is transferred to the output latch/driver to drive the SDQ terminal. This provides the first bit of data very quickly. Simultaneously, the next data bit is accessed in the SAM, sensed, and loaded into the Read Register. The tap address counter is incremented, and thus the circuit is ready for the next SC clock signal. Responsive to the next SC clock signal, the new Read Register data is transferred to the output latch/driver, and the cycle just described is repeated.

This novel method speeds the read operation by performing many of the necessary read operation steps concurrently, rather than performing all of them serially as in the prior art. In a preferred embodiment, the serial read operation is partitioned (or "pipelined") to form a sensing operation, a counter operation and an output operation. All three operations proceed concurrently. These operations and the related control logic signals are detailed in the following TABLE:

TABLE 1
PIPELINED SERIAL READ OPERATION.

| DESCRIPTION | CONTROL LOGIC SIGNAL |
|---|---|
| OUTPUT OPERATION | |
| 1.) Transfer Read Register data to output latch (master/slave) | SCPIPE |
| 2.) Drive Output Terminal (SDQ) | |
| SENSING OPERATION | |
| 1.) Turn off equalization of SIO lines and Enable Serial Decoder | SPRE ENABLE |
| 2.) Access selected SAM cell and develop signal on SIO lines | |
| 3.) Isolate SIO lines from Serial Helper Flip Flop (SHFF) | HIM* |
| and latch the SHFF, which automatically sets the Read Register to the proper state | SHF |
| 4.) Disable the Serial Decoder; | ENABLE |
| Equalize SIO lines; | SPRE |
| Disable SHFF and reconnect the SHFF to the equalizing SIO lines. | SHF HIM* |
| COUNTER OPERATION | |
| 1.) Isolate the counter from the pre-decoder (sample & hold) | SAMX* |
| 2.) Increment the counter | SCK |
| 3.) Reconnect the counter to the pre-decoder | SAMX* |

Simulations show that the foregoing method can decrease the serial port cycle time by about 40–50%. In addition, the access time $t_{SAC}$ is reduced by approximately 75%. Using the new method, operating speed is limited by the address counter and decoder.

Specific Circuit Details

Figure 4:
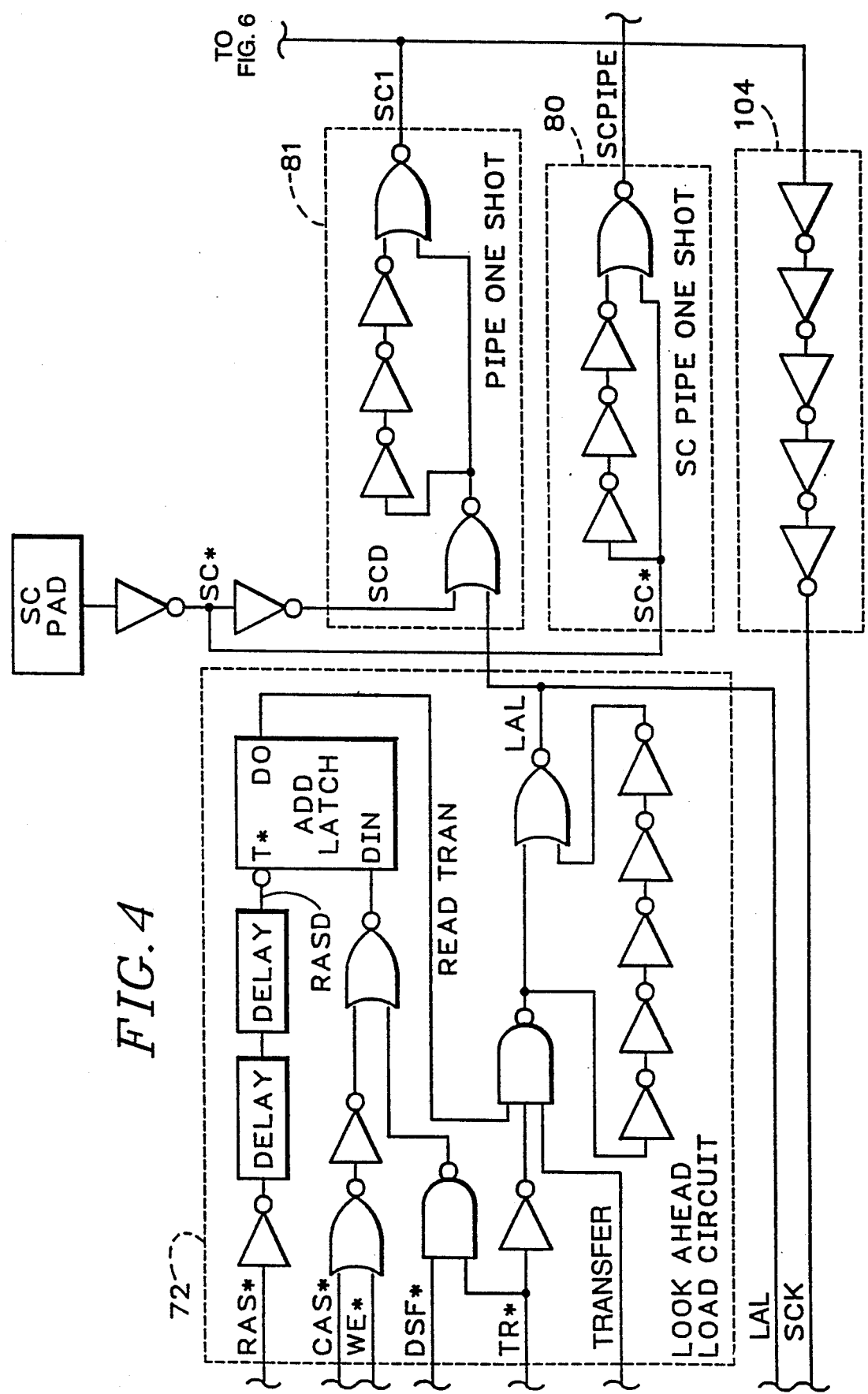
FIG. 4 is a schematic diagram showing detail of look-ahead load and one-shot circuitry of the VRAM of FIG. 3A.

FIG. 4 is a schematic diagram showing detail of the look-ahead load circuit 72, the pipe one-shot circuit 81 and the SC pipe one-shot circuit 80. Operation of these circuits will be apparent to those skilled in the art in view of the schematic diagrams and the timing diagram of FIG. 10.

FIG. 4 also shows delay circuit 104 which comprises a series of five invertors, to provide a short delay between the input signal SC1 and the output signal SCK. SCK increments the address counter shortly after the SC signal.

Figure 5:
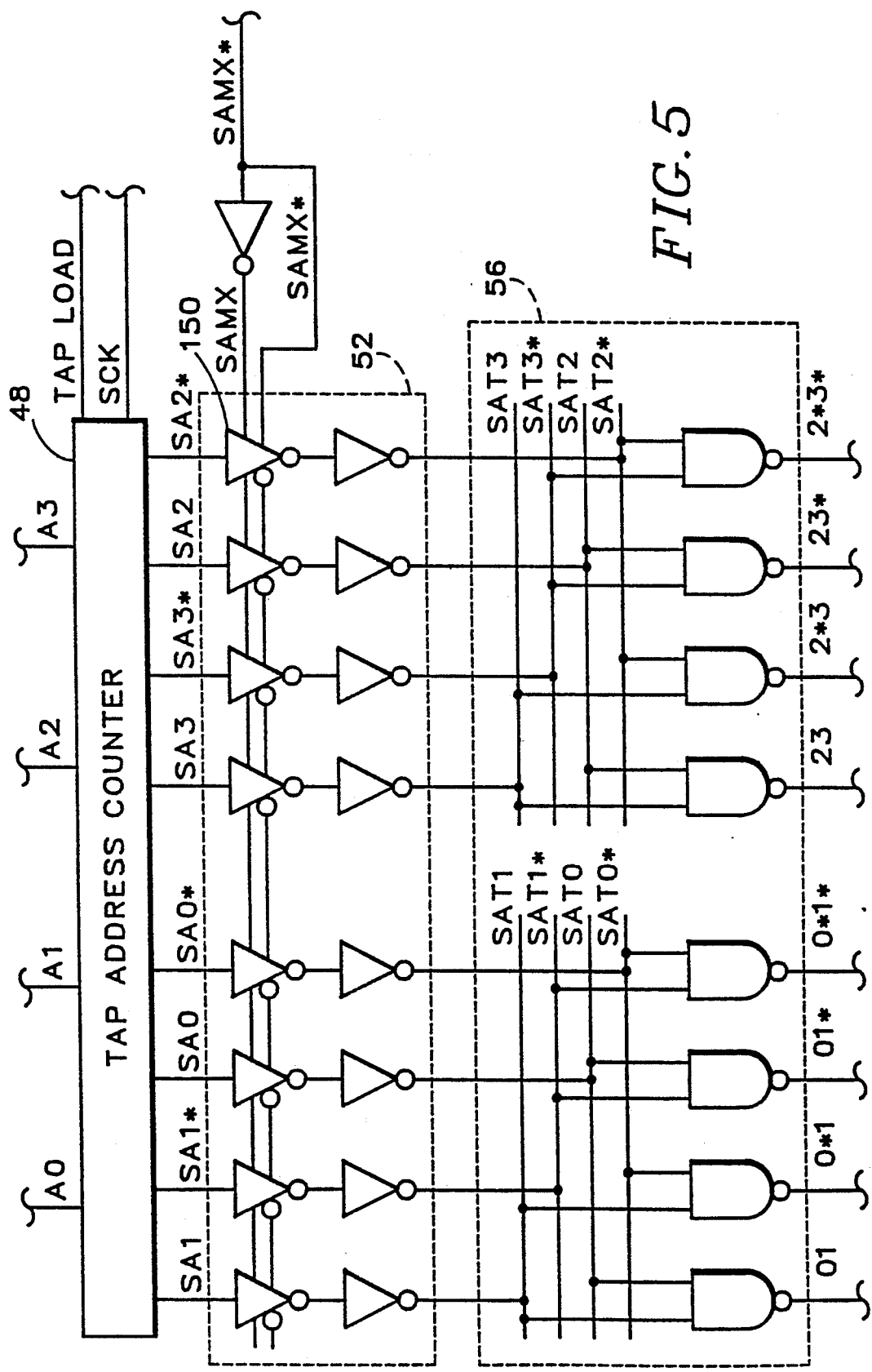
FIG. 5 is a schematic diagram showing detail of the isolation buffer and SAM pre-decoder circuitry of FIG. 3A.

FIG. 5 shows detail of the isolation buffer circuit 52. The isolation buffer comprises a series of tri-state invertors, for example invertor 150, each coupled to receive a respective one of the serial address signals SA0-SA2 at the tap address counter 48 output terminals. All of the invertors are controlled by the SAMX* signal provided by the serial logic 84, described next.

Figure 6:
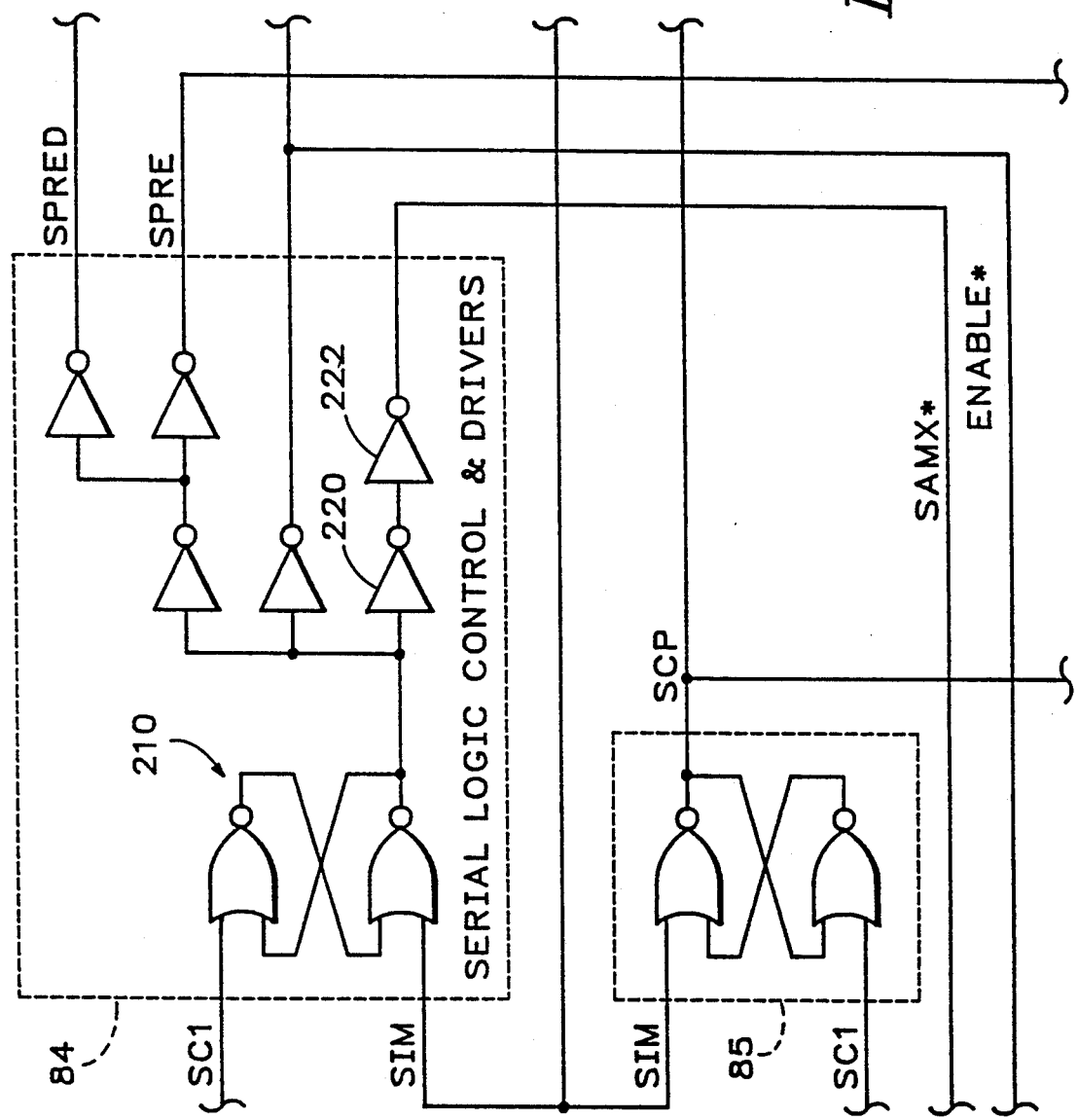
FIG. 6 is a schematic diagram showing detail of the serial logic control circuitry of FIG. 3B.

FIG. 6 shows detail of serial logic control & drivers circuit 84. Latch 210 passes the SIM signal through as SAMX* as long as SC1, the SC clock signal pulse is HIGH. SPRE and SAMX* can be the same signal.

Figure 9:
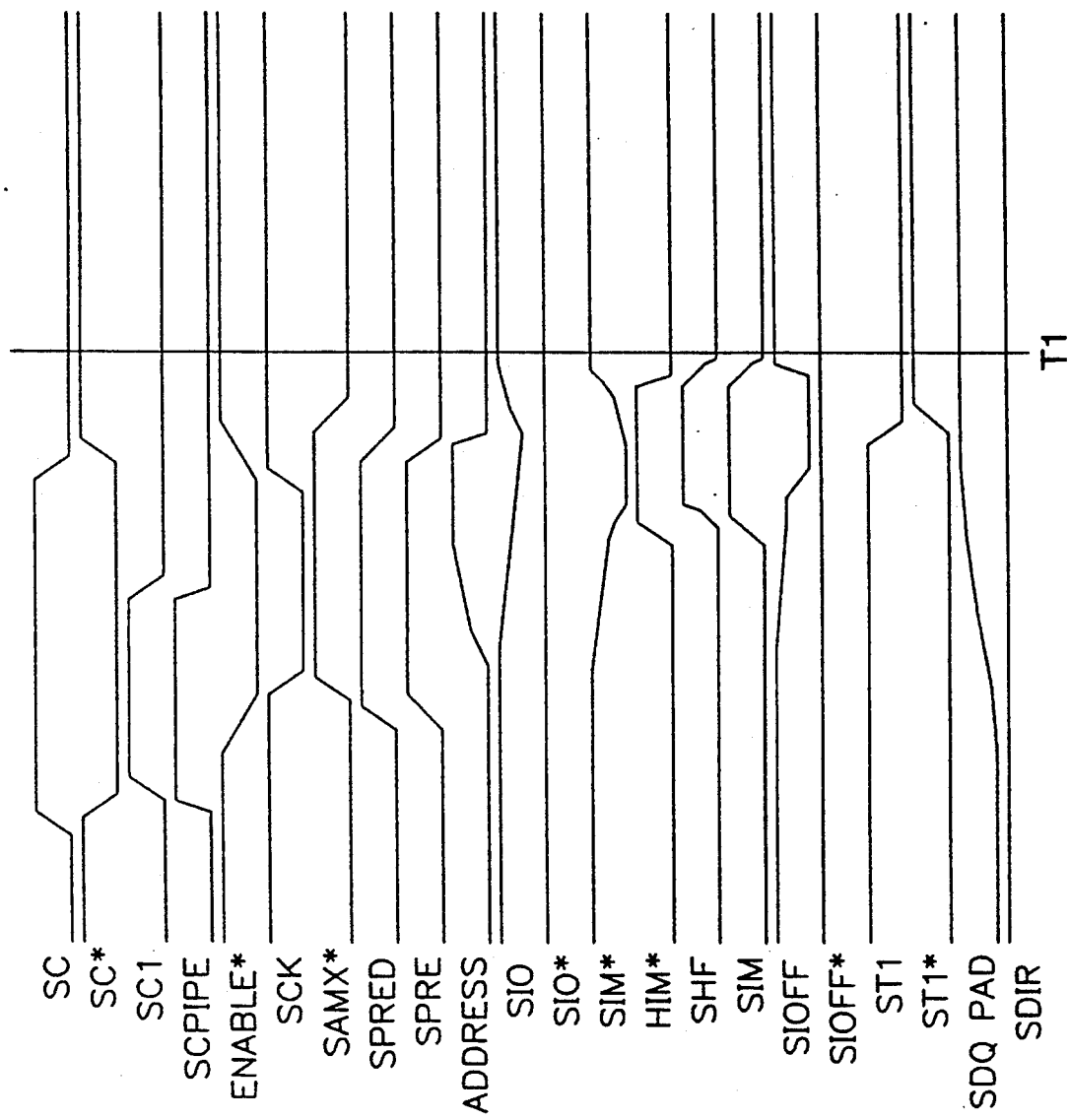
FIG. 9 is a timing diagram showing pipelined serial output waveforms illustrating operation of the circuitry of FIGS. 3-7.

FIG. 9 shows pipelined serial output waveforms for signals of the present invention. The reading of a zero follows the previous output of a one. At and after time T1, the VRAM is ready for the next SC pulse.

Figure 10:
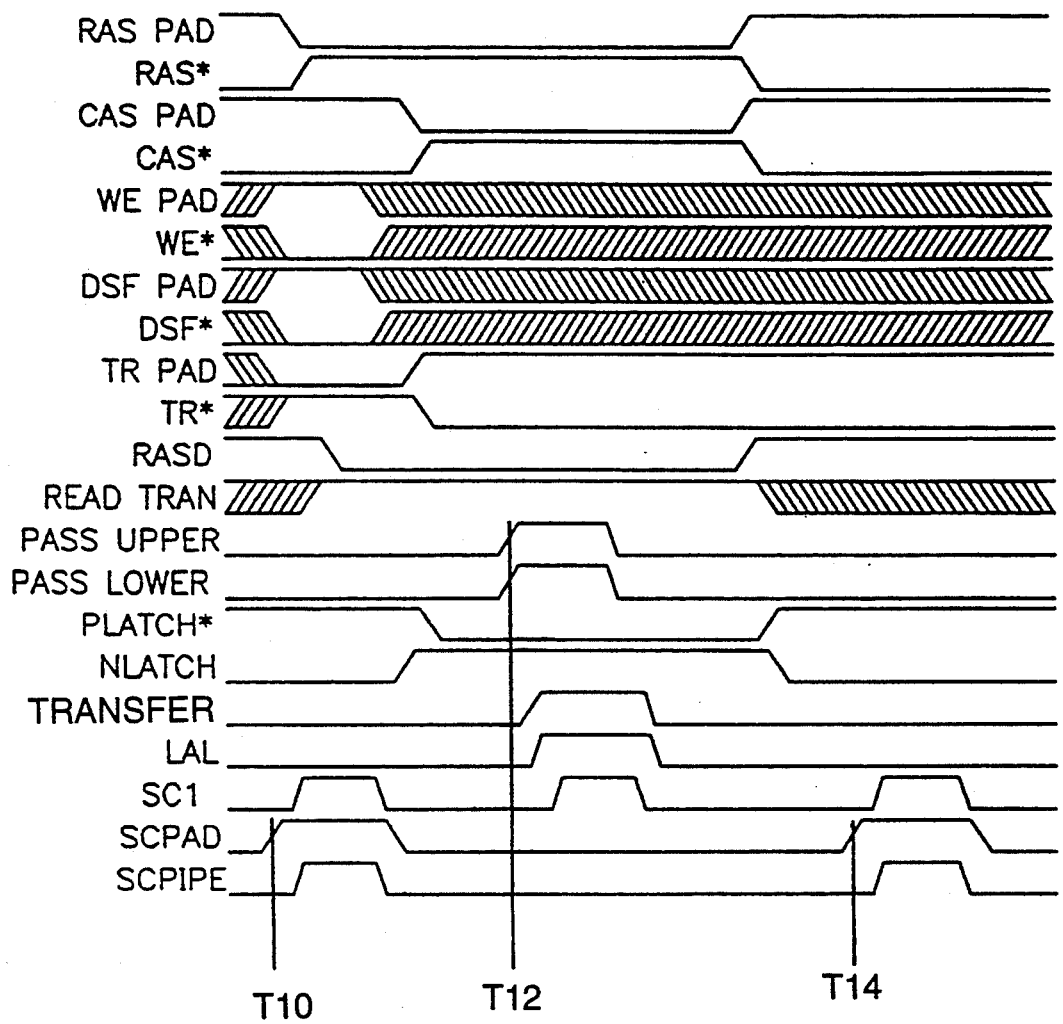
FIG. 10 is a timing diagram illustrating a read transfer operation and showing selected logic signals related to the look-ahead load circuit of FIG. 4.

FIG. 10 shows read transfer waveforms for signals of the present invention which generate look-ahead. At time T10 the last SC pulse is received before transfer. At time T12, a read transfer occurs. At time T14, the first SC pulse is received after transfer.

Having illustrated and described the principles of my invention in a preferred embodiment thereof, it should be readily apparent to those skilled in the art that the invention can be modified in arrangement and detail without departing from such principles.

I claim all modifications coming within the spirit and scope of the accompanying claims:

1. An integrated video random access memory circuit, responsive to a transfer signal and a clock signal for providing an output signal, the circuit comprising:
   a. a memory array;
   b. a serial access register coupled for reading the memory array in response to the transfer signal;
   c. a counter for providing a counter output signal, and for incrementing the counter output signal, the counter operable when selectively enabled;
   d. a decoder for decoding the counter output signal and for providing a decoded signal that identifies a cell in the serial access register, the decoder operable when selectively enabled;
   e. a hold circuit for selectively maintaining the counter output signal to the decoder while the counter is incrementing;
   f. a sense amplifier for reading the cell in the serial access register identified by the decoded signal, the sense amplifier operable when selectively enabled;
   g. an output buffer comprising a master flip-flop selectively coupled to a slave flip-flop, the slave flip-flop for providing the output signal; and h. a control circuit for enabling, in parallel response to the clock signal, the coupling of the master flip-flop to the slave flip-flop for providing the output signal, the maintaining of the counter output signal for decoding, and the incrementing of the counter.

2. An integrated video random access memory circuit, responsive to a transfer signal, a tap address signal, and a clock signal for providing an output signal, the circuit comprising:
   a. a memory array;
   b. a serial access register coupled for reading the memory array in response to the transfer signal;
   c. a counter for providing a counter output signal responsive to the tap address signal, and for incrementing the counter output signal, the counter operable when selectively enabled;
   d. a decoder for decoding the counter output signal and for providing a decoded signal that identifies a
   . cell in the serial access register, the decoder operable when selectively enabled;
   e. a hold circuit for selectively maintaining the counter output signal to the decoder while the counter is incrementing;
   f. a sense amplifier for reading the cell in the serial access register identified by the decoded signal, the sense amplifier operable when selectively enabled;
   g. an output buffer comprising a master flip-flop selectively coupled to a slave flip-flop, the slave flip-flop for providing the output signal; and
   h. a control circuit for enabling, in parallel response to the transfer signal, the sensing of a cell identified by the tap address signal for storage in the master flip-flop, the maintaining of the counter output signal for decoding, and the incrementing of the counter.

3. A memory for providing an output signal, the memory comprising:
   a. a plurality of memory cells comprising a first cell, a second cell, and a third cell;
   b. pointing means for assigning a value to an address signal, and for providing the address signal having an assigned value, the pointing means characterized by a first propagation delay for assigning;
   c. reading means for reading a cell identified by the address signal, and for providing the output signal corresponding to a cell that has been read, the reading means characterized by a second propagation delay for reading; and
   d. timing means for controlling the pointing means and the reading means so that a portion of the first propagation delay is passing while a portion of the second propagation delay is passing.

4. The memory of claim 3 wherein:
   a. the reading means is characterized by a third propagation delay for providing the output signal; and
   b. the timing means controls the pointing means and the reading means so that while a portion of the first propagation delay is passing:
      (1) a portion of the second propagation delay is passing; and
      (2) a portion of the third propagation delay is passing.

5. An integrated circuit for providing an output signal, the integrated circuit comprising:
   a. a first plurality of memory cells comprising a first cell and a second cell;
   b. pointing means for providing an address signal identifying the first cell at a first time, for determining a next address signal from a predetermined sequence at a second time, and for providing an address signal identifying the second cell at a third time;
   c. a hold circuit for providing a held signal responsive to the address signal when the hold circuit is disabled, and for providing the held signal independent of the address signal after the hold circuit is enabled;
   d. reading means for reading a cell identified by the held signal, and for providing the output signal corresponding to a cell that has been read; and
   e. timing means for controlling the pointing means, the hold circuit, and the reading means so that during the second time, the hold circuit is enabled and the reading means is reading a cell identified by the held signal.

6. The integrated circuit of claim 5 wherein:
   a. the first cell and the second cell are part of a register;
   b. the integrated circuit receives a transfer signal;
   c. the integrated circuit further comprises a second plurality of memory cells arranged as a row of cells;
   d. the integrated circuit further comprises transferring means, responsive to the transfer signal, for transferring data from the row into the register; and
   e. the timing means is responsive to the transfer signal for controlling the pointing means, the hold circuit, and the reading means so that during the second time, the hold circuit is enabled, and the reading means is reading a cell identified by the held signal.

7. The integrated circuit of claim 6 wherein:
   a. the integrated circuit receives a clock signal; and
   b. the timing means is responsive to the clock signal for controlling the pointing means, the hold circuit, and the reading means so that during the second time, the hold circuit is enabled, and the reading means is reading a cell identified by the held signal.

8. A memory for providing an output signal, the memory comprising:
   a. a plurality of memory cells comprising a first cell, a second cell, and a third cell;
   b. pointing means for assigning a value to an address signal, and for providing the address signal having an assigned value;
   c. reading means for reading a cell identified by the address signal, and for providing the output signal corresponding to a cell that has been read; and
   d. timing means for controlling the pointing means and the reading means so that the pointing means is assigning a value to the address signal corresponding to the third cell while:
      (1) the pointing means is providing the address signal corresponding to the second cell; and while
      (2) the reading means is reading the second cell.

9. The memory of claim 8 wherein:
   a. the first cell, the second cell, and the third cell are part of a register;
   b. the plurality of memory cells further comprises a row of cells;
   c. the memory receives a transfer signal, and the memory further comprises transferring means, responsive to the transfer signal, for transferring data from the row into the register; and d. the timing means is responsive to the transfer signal for controlling the pointing means and the reading means so that the pointing means is assigning a value to the address signal corresponding to the third cell while:
  (1) the pointing means is providing the address signal corresponding to the second cell; and while
  (2) the reading means is reading the second cell.

10. The memory of claim 9 wherein the pointing means comprises a counter for determining, at a first time, a first value, and for determining, at a later time, a second value.

11. The memory of claim 10 wherein the pointing means comprises a hold circuit, operative while the counter is determining the second value, for selectively maintaining the first value, and for providing the address signal responsive to the first value.

12. The memory of claim 11 wherein the hold circuit is enabled by the timing means in response to the transfer signal.

13. The memory of claim 8 wherein the timing means controls the pointing means and the reading means so that the reading means is providing the output signal corresponding to the first cell while:
  a. the pointing means is assigning a value to the address signal corresponding to the third cell;
  b. the pointing means is providing the address signal corresponding to the second cell; and while
  c. the reading means is reading the second cell.

14. The memory of claim 13 wherein:
  a. the memory receives a clock signal; and
  b. the timing means is responsive to the clock signal for controlling the pointing means and the reading means so that the reading means is providing the output signal corresponding to the first cell while:
    (1) the pointing means is assigning a value to the address signal corresponding to the third cell;
    (2) the pointing means is providing the address signal corresponding to the second cell; and while
    (3) the reading means is reading the second cell.

15. The memory of claim 14 wherein the pointing means comprises a counter for determining, at a first time, a first value, and for determining, at a later time, a second value.

16. The memory of claim 15 wherein the pointing means comprises a hold circuit, operative while the counter is determining the second value, for selectively maintaining the first value, and for providing the address signal responsive to the first value.

17. The memory of claim 16 wherein the hold circuit is enabled by the timing means in response to the clock signal.

18. The memory of claim 8 wherein:
  a. the second cell provides a data signal for conveying the content of the second cell;
  b. the reading means comprises:
    (1) sensing means for amplifying the data signal and for providing a sense output signal; and
    (2) outputting means, selectively coupled to the sensing means, for providing the output signal in response to the sense output signal.

19. The memory of claim 18 wherein the sensing means comprises a master flip-flop for providing the sense output signal, and the outputting means comprises:
  a. a slave flip-flop for providing the output signal; and
  b. a hand-off circuit for selectively coupling the master flip-flop to the slave flip-flop.

20. The memory of claim 19 wherein:
  a. the memory receives a clock signal; and
  b. the hand-off circuit is enabled by the timing means in response to the clock signal.

* * * * *